(12) United States Patent
Park

(10) Patent No.: US 7,450,459 B2
(45) Date of Patent: Nov. 11, 2008

(54) MULTI-PORT MEMORY DEVICE

(75) Inventor: Byung-Il Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 823 days.

(21) Appl. No.: 10/877,837

(22) Filed: Jun. 25, 2004

(65) Prior Publication Data

US 2005/0273670 A1 Dec. 8, 2005

(30) Foreign Application Priority Data

May 6, 2004 (KR) .................. 10-2004-0031964

(51) Int. Cl.
*G11C 17/18* (2006.01)

(52) U.S. Cl. .................. 365/225.7; 365/200; 365/201; 365/230.08

(58) Field of Classification Search .......... 365/230.05, 365/200, 201, 225.7, 230.03, 230.08
See application file for complete search history.

(56) References Cited

U.S. PATENT DOCUMENTS 6,418,066 B1 * 7/2002 Hidaka .................. 365/198
7,016,255 B2 * 3/2006 Lee et al. ................ 365/230.05

FOREIGN PATENT DOCUMENTS

KR 2001-0036463 5/2001
KR 10-0605573 7/2006

* cited by examiner

*Primary Examiner*—Anh Phung
*Assistant Examiner*—Toan Le
(74) *Attorney, Agent, or Firm*—Blakely, Sokoloff, Taylor & Zafman

(57) ABSTRACT

There is provided a column repair technology of a semiconductor memory device. The semiconductor memory device includes: a normal bus connection part for transmitting/receiving data between global data buses and local data buses of each bank; a redundant bus connection part for transmitting/receiving data between global data buses and local data buses of each bank; a fuse set having a physical position information of a fail column; and a switching part for selectively connecting outputs of the normal bus connection part and the redundant bus connection part to the global data buses, which corresponds to the fail column, in response to the physical position information of the fail column. The column redundancy scheme can be applied to semiconductor memory devices having such a structure that a lot of column selection lines are enabled with respect to one column address and can also be applied to a case when a fail column address is not present. Therefore, the redundancy efficiency can be improved and an increase of the chip area can be prevented.

1 Claim, 12 Drawing Sheets

MULTI-PORT MEMORY DEVICE

FIELD OF THE INVENTION

The present invention relates to a semiconductor memory design technology; and, more particularly, to a column repair technology of a semiconductor memory device.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CPU, and so on. In order to implement such a multi-port memory device, any one of a plurality of ports must be able to provide an access to all memory cells.

FIG. 1 is a block diagram illustrating an architecture of a 256M multi-port DRAM, which is disclosed in Korean Patent Application No. 2003-92375, filed by the same applicant on Dec. 17, 2003.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks QTRX.

The plurality of banks bank0 to bank15 are arranged in a row direction (a right and left direction in the drawing) as many as a predetermined number at four divided sections (quadrants) of a core area.

The control block 100 is arranged between the first/third quadrants and the second/fourth quadrants to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quadrants and perform an independent communication with different target devices.

The first to fourth global data buses GIO_UL, GIO_UR, GIO_DL and GIO_DR are arranged between each bank and each port corresponding to the respective quadrants in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks The plurality of transfer bus connection blocks TG arranged between two banks, which are adjacent to each other in a column direction, and selectively connect the two transfer buses TB.

The plurality of bus connection blocks TL are arranged between each bank and each global data bus of the quadrant in which each bank is contained, and perform a data exchange between the corresponding transfer bus TB and the corresponding global data bus.

The plurality of data transfer blocks QTRX are arranged between each port and each global data bus of the quadrant in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8 k(row)×2 k(column)) and the row decoder RDEC. Each bank includes a core circuit, such as a bit line sense amplifier and an equalizer, which is necessary in a typical DRAM core. The banks bank0 to bank15 are arranged at the four quadrants, each of which includes four banks in a row direction. In detail, the banks bank0, bank2, bank4 and bank6 are arranged at the first quadrant (a left and up section) of the core area, and the banks bank8, bank10, bank12 and bank14 are arranged at the second quadrant (a right and up section). Also, the banks bank1, bank3, bank5 and bank7 are arranged at the third quadrant (a left and down section), and the banks bank9, bank11, bank 13 and bank15 are arranged at the fourth quadrant (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA, and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quadrants, each of which includes two ports. The die edge portion means a major axis portion shared by all banks of the corresponding quadrant. In detail, the ports port0 and port2 are arranged at the first quadrant, and the ports port4 and port6 are arranged at the second quadrant. The ports port1 and port3 are arranged at the third quadrant, and the ports prot5 and port7 are arranged at the fourth quadrant. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quadrant, and the second global data bus GIO_UR is arranged at the second quadrant. The third global data bus GIO_DL is arranged at the third quadrant, and the fourth global data bus GIO_DR is arranged at the fourth quadrant. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quadrants, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buses for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quadrant to which the corresponding bank belongs. The write bus connection circuit includes a write latch for sensing and latching a write data, which is applied on the global data bus, and a write driver for driving the write data to the transfer bus TB.

The data transfer block QTRX includes a transmitter (QTx) for transmitting a write data applied on a corresponding port to the global data bus, and a receiver (QRx) for receiving a read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quadrants and between the ports corresponding to the third and fourth quadrants. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quadrants. Transfer gate control lines (TGC<0:3>) extending from the control block 100 to the transfer bus connection block TG are provided at the right and left sides of the control block 100.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2 k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quadrant can be connected through the transfer gates TG to the transfer buses TB corresponding to each bank of the third quadrant, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (QRx) of the data transfer block QTRX corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (QTx) of the data transfer block QTRX and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block QTRX of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array.

In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quadrants of the core area through an application of the new architecture and can input/output data in serial at the ports. Accordingly, an increase of a layout area is minimized, a packaging is simplified, and a bandwidth is greatly increased without causing a skew between data lines at the data buses.

Meanwhile, a semiconductor memory device, such as the multi-port memory device, in which a large number (256 or 512) of column selection lines (yi) are enabled with respect to one column address, has difficulty in performing a column repair.

FIG. 5 illustrates a column redundancy scheme according to the prior art.

Referring to FIG. 5, in case where a column fail occurs, a column redundancy scheme according to the prior art cuts out a fuse set with respect to a fail column address and compares an input column address with an address of the cut-out fuse set in order to enable the column selection lines (yi). If the input column address is equal to the address of the cut-out fuse set, a "yikillb" signal is activated to thereby disable a normal column selection line (yi) and enable a redundant column selection line (yi).

Like this, the column redundancy scheme according to the prior art is very useful when the number of the column selection lines (yi) enabled with respect to one column address is small. However, in case the number of the column selection lines (yi) is increased, a size of the redundant cell is also increased, thus increasing an area occupied by spare cells, which are provided for the column redundancy, and degrading a repair efficiency.

Further, the column redundancy scheme according to the prior art cannot be applied to a semiconductor memory device having no column address.

SUMMARY OF THE INVENTION

It is, therefore, an object of the present invention to provide a multi-port memory device with column redundancy structure, which is capable of minimizing a semiconductor memory device, which is capable of minimizing an increase of a chip area even when a large number of column selection lines are enabled with respect to one column address.

In an aspect of the present invention, there is provided a semiconductor memory device, comprising: a normal bus connection means for transmitting/receiving data between global data buses and local data buses of each bank; a redundant bus connection means for transmitting/receiving data between global data buses and local data buses of each bank; a fuse set having a physical position information of a fail column; and a switching means for selectively connecting outputs of the normal bus connection means and the redundant bus connection means to the global data buses, which corresponds to the fail column, in response to the physical position information of the fail column.

In another aspect of the present invention, there is provided a semiconductor memory device comprising a plurality of transfer latch sets, each of which has transfer latches corresponding to predetermined-bit transfer buses and redundant transfer latches corresponding to left and right redundant transfer buses, wherein the transfer latch sets includes a left half block and a right half block, the left half block including: switch blocks for receiving normal I/Os and one redundant I/O; and a left column redundancy address fuse set circuit/decoder for disabling I/O of a fail column and providing information for converting the redundant I/O into a corresponding physical position, the right half block including: switch blocks for receiving normal I/Os and one redundant I/O; and a right column redundancy address fuse set circuit/ decoder for disabling I/O of a fail column and providing information for converting the redundant I/O into a corresponding physical position.

The column redundancy in accordance with the present invention can be applied to semiconductor memory devices having such a structure that a lot of column selection lines are enabled with respect to one column address and can also be applied to a case when a fail column address is not present. Therefore, the redundancy efficiency can be improved and an increase of the chip area can be prevented.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 1:
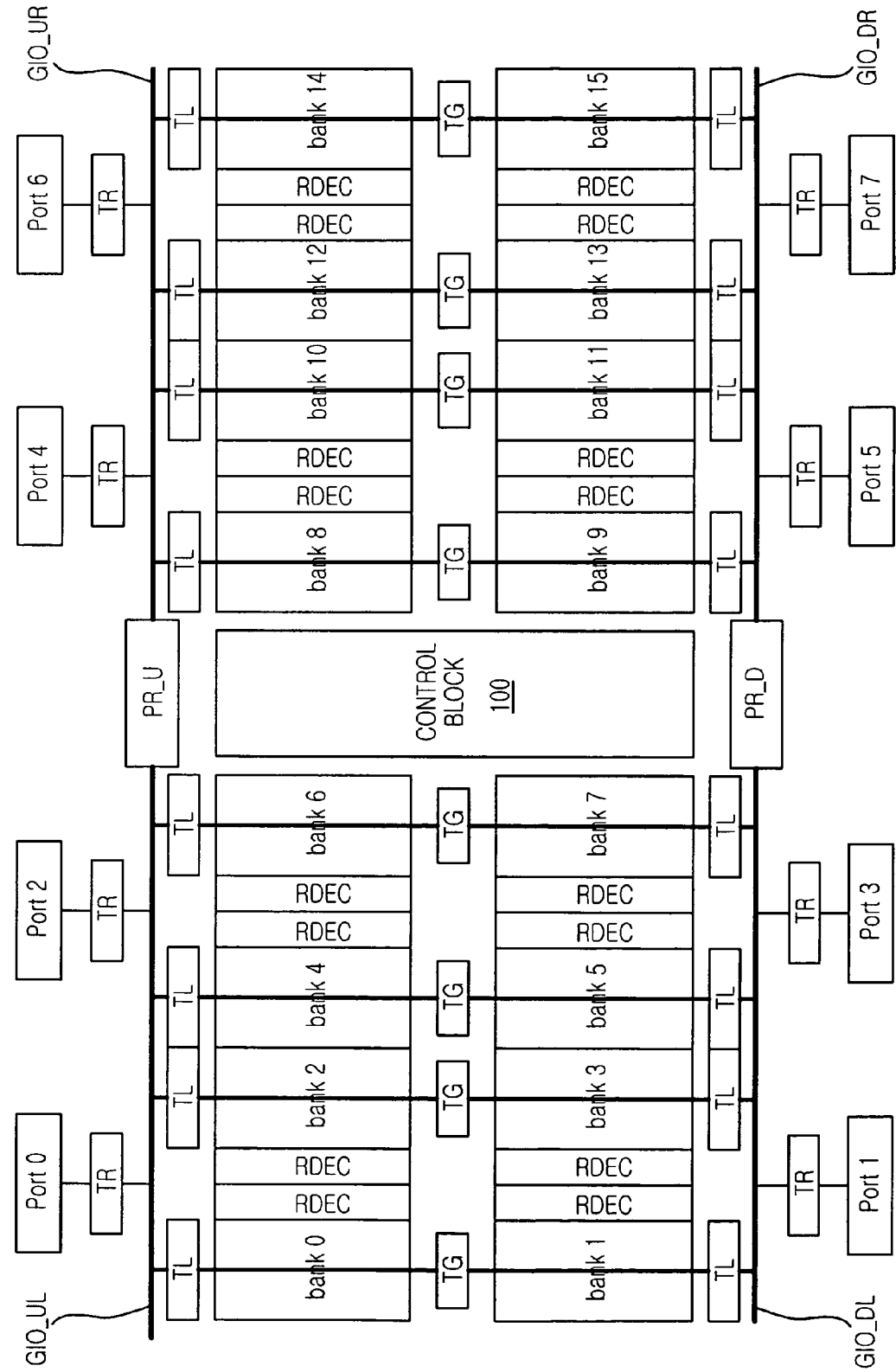
FIG. 1 illustrates an architecture of a 256M multi-port DRAM, which is disclosed in Korean Patent Application No. 2003-92375.
Figure 2:
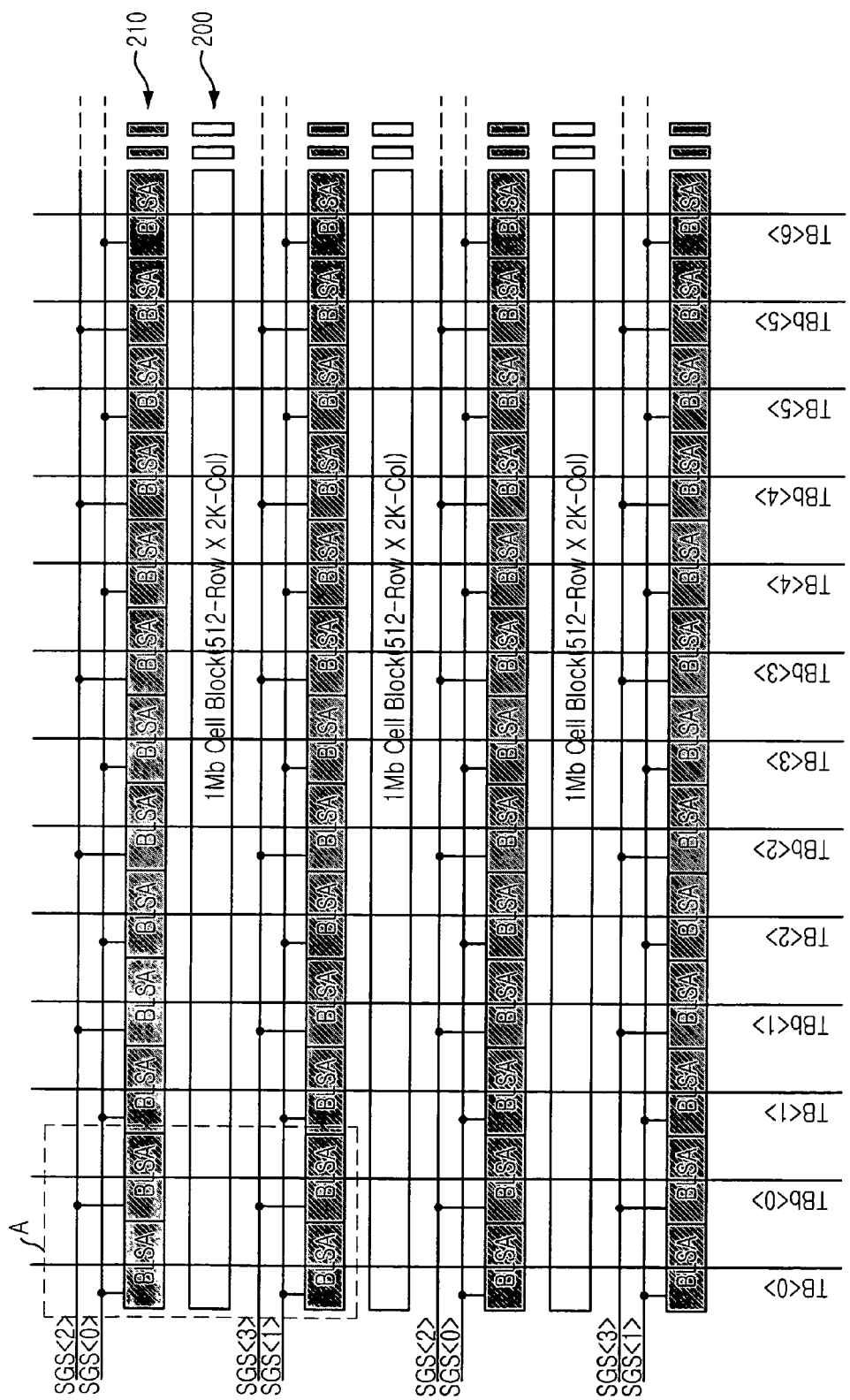
FIG. 2 is a block diagram illustrating a segment and a transfer bus TB in the 256M multi-port DRAM of FIG. 1.
Figure 3A:
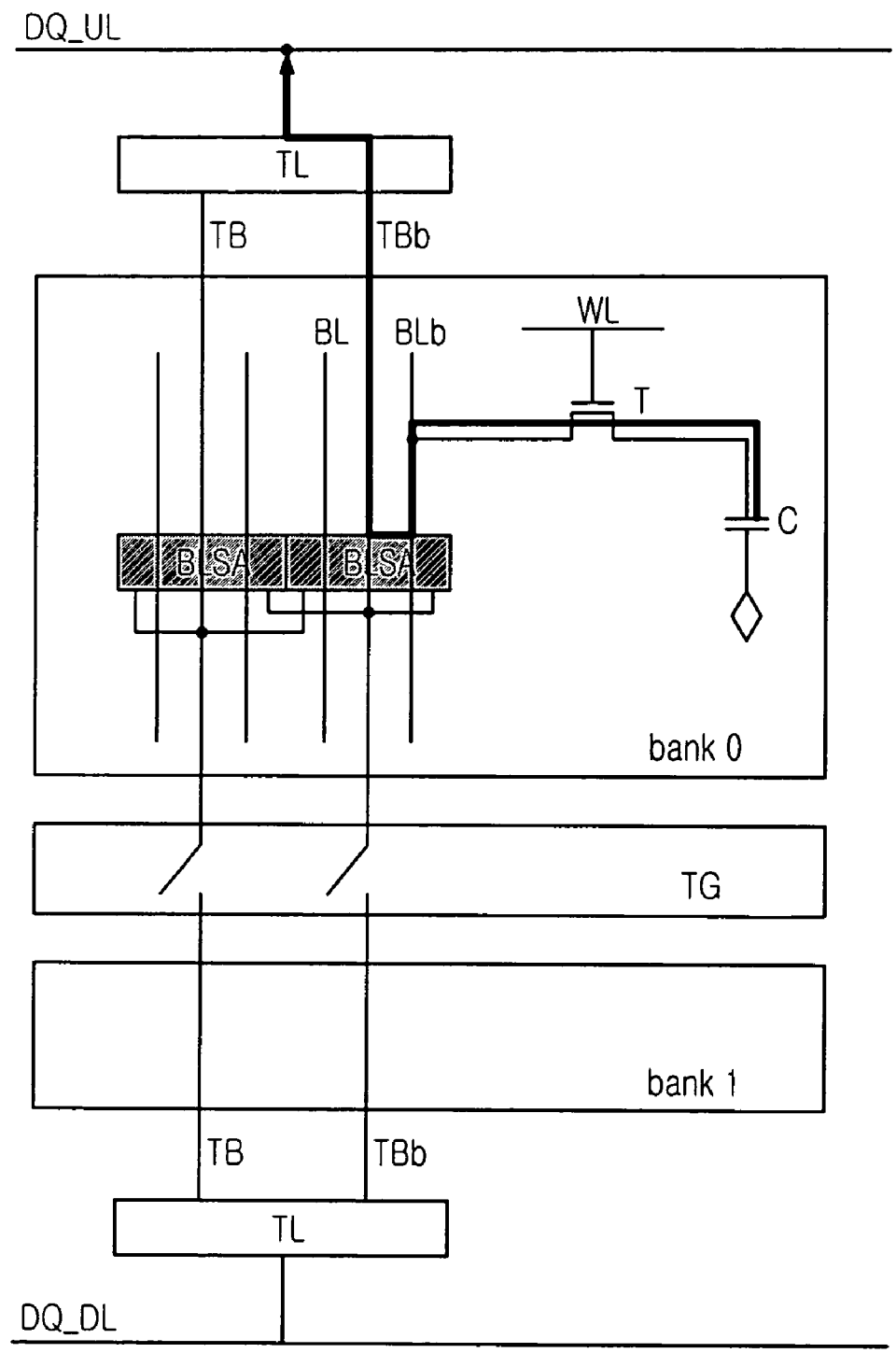
FIG. 3A illustrates a normal read path of the 256M multi-port DRAM depicted in FIG. 2.
Figure 3B:
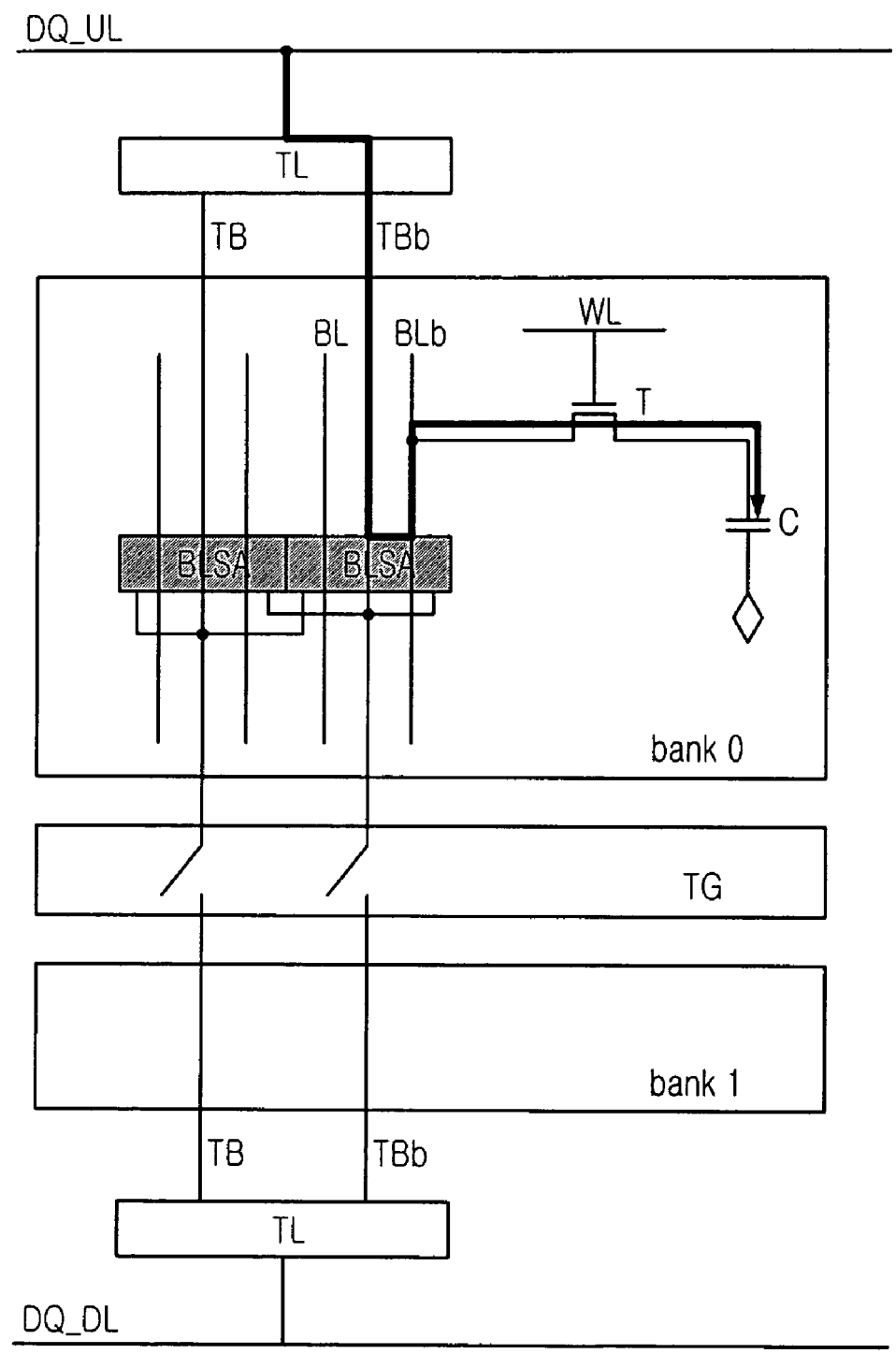
FIG. 3B illustrates a normal write path of the 256M multi-port DRAM depicted in FIG. 2.
Figure 4A:
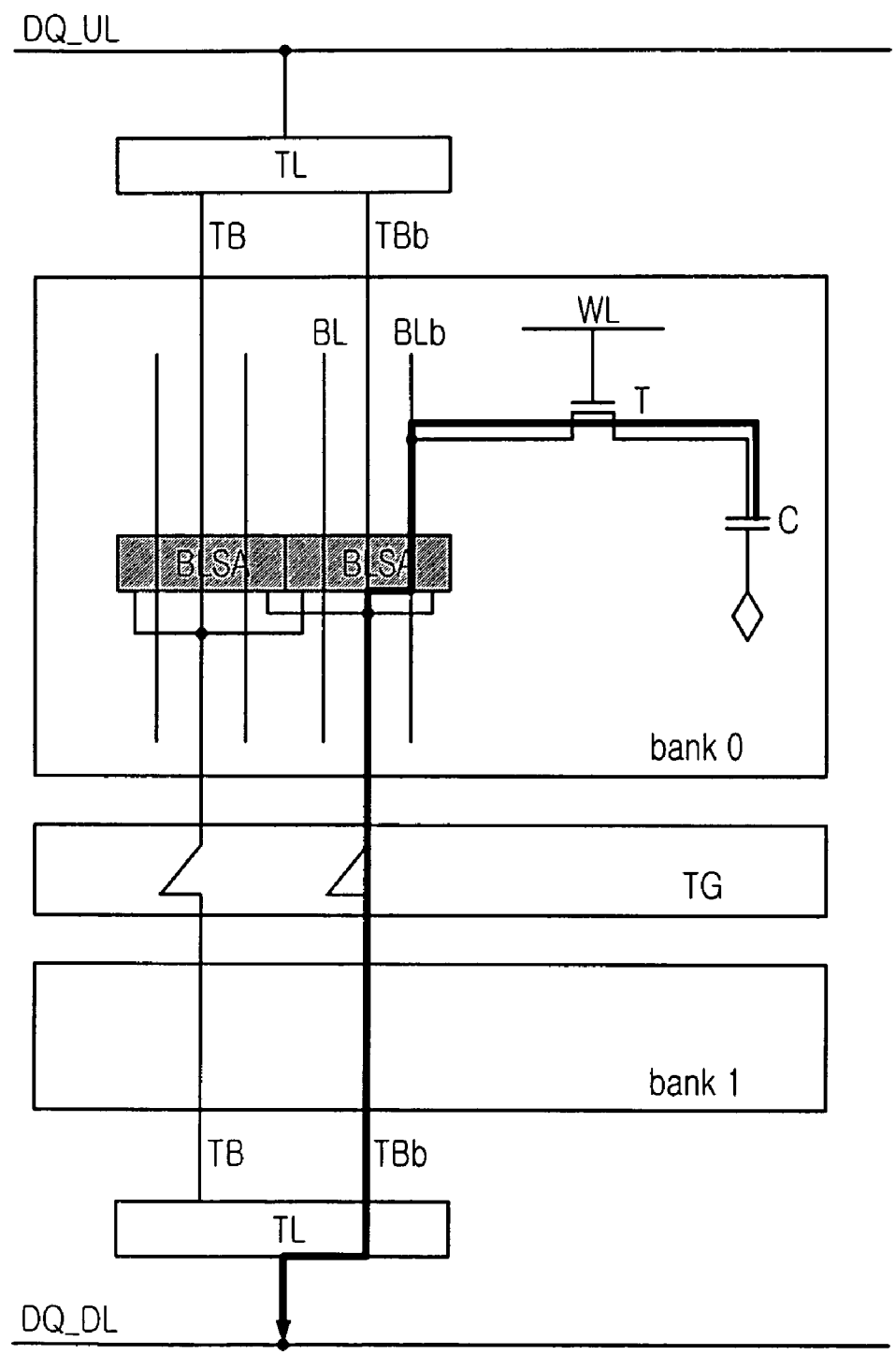
FIG. 4A illustrates a cross read path of the 256M multi-port DRAM depicted in FIG. 2.
Figure 4B:
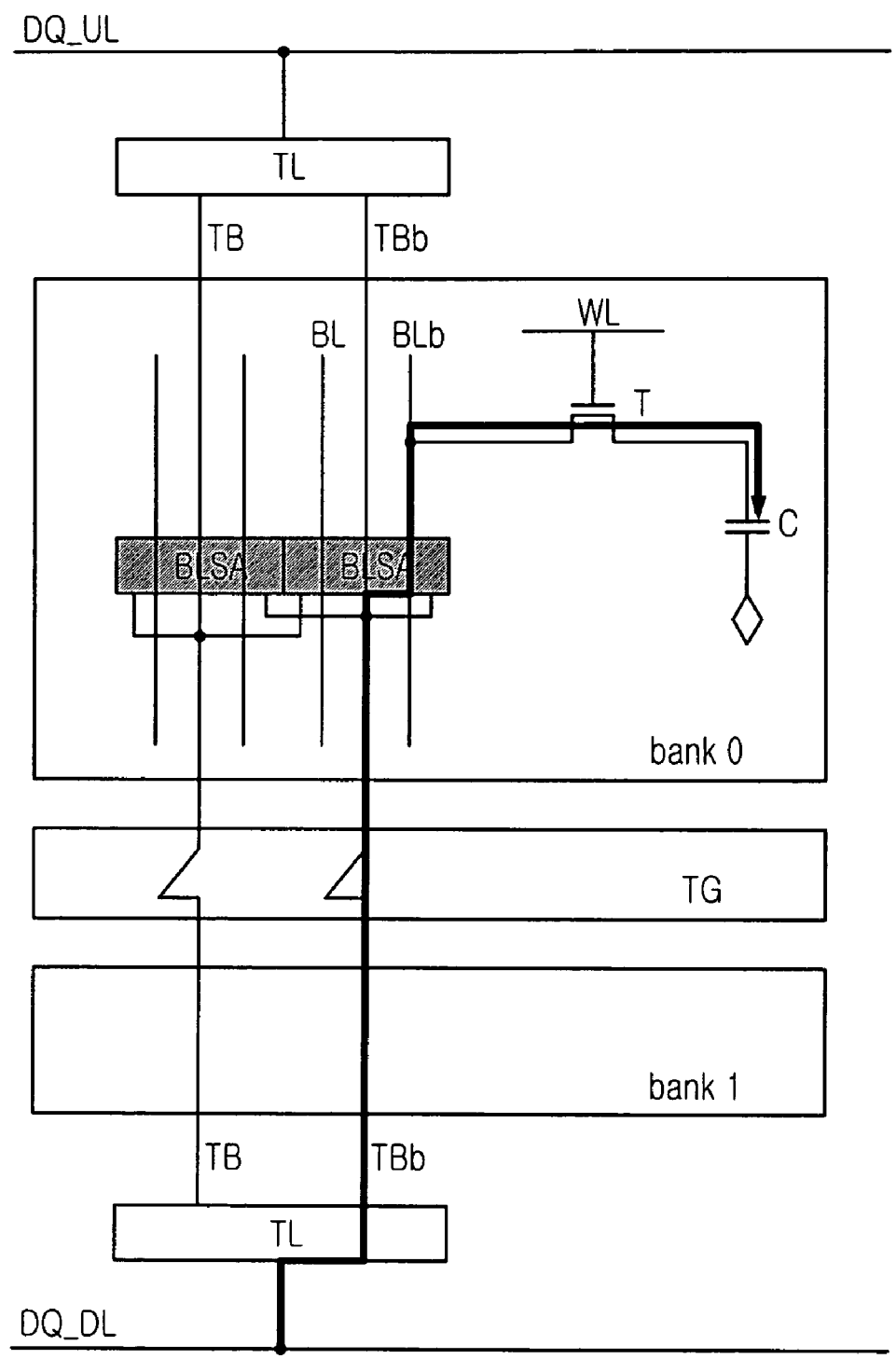
FIG. 4B illustrates a cross write path of the 256M multi-port DRAM depicted in FIG. 2.
Figure 5:
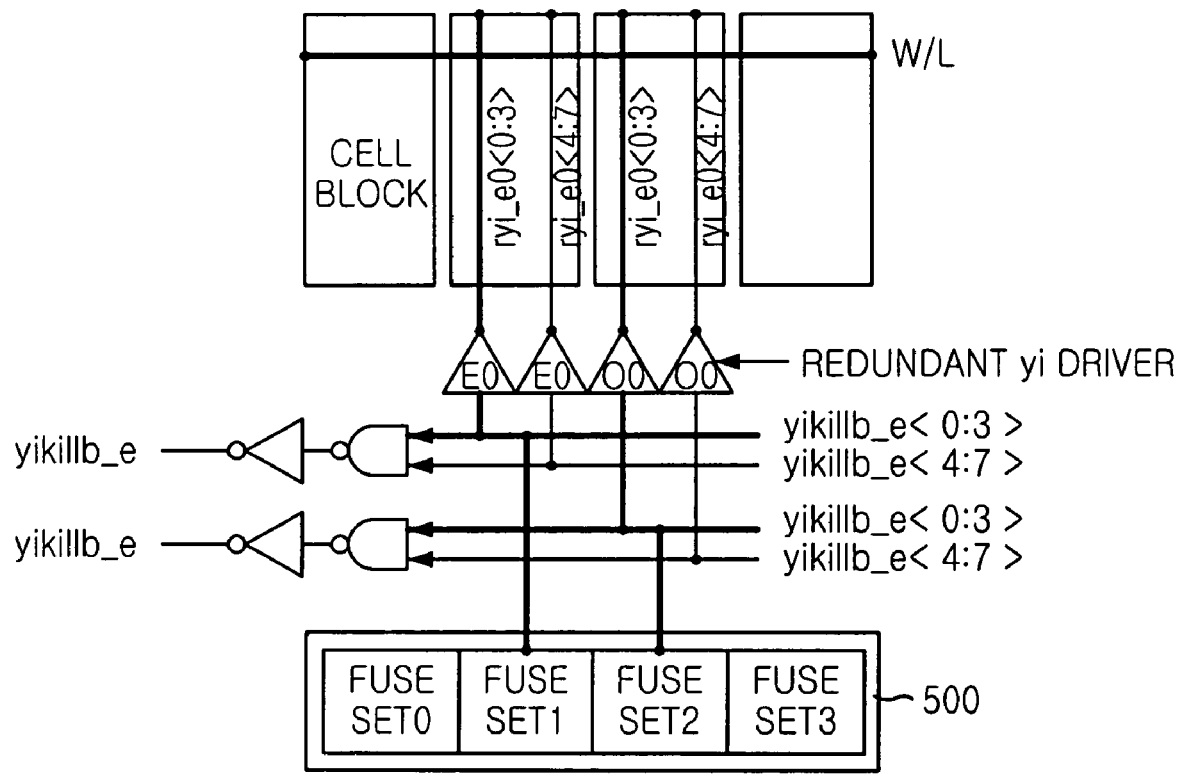
FIG. 5 illustrates a column redundancy scheme according to the prior art.
Figure 6:
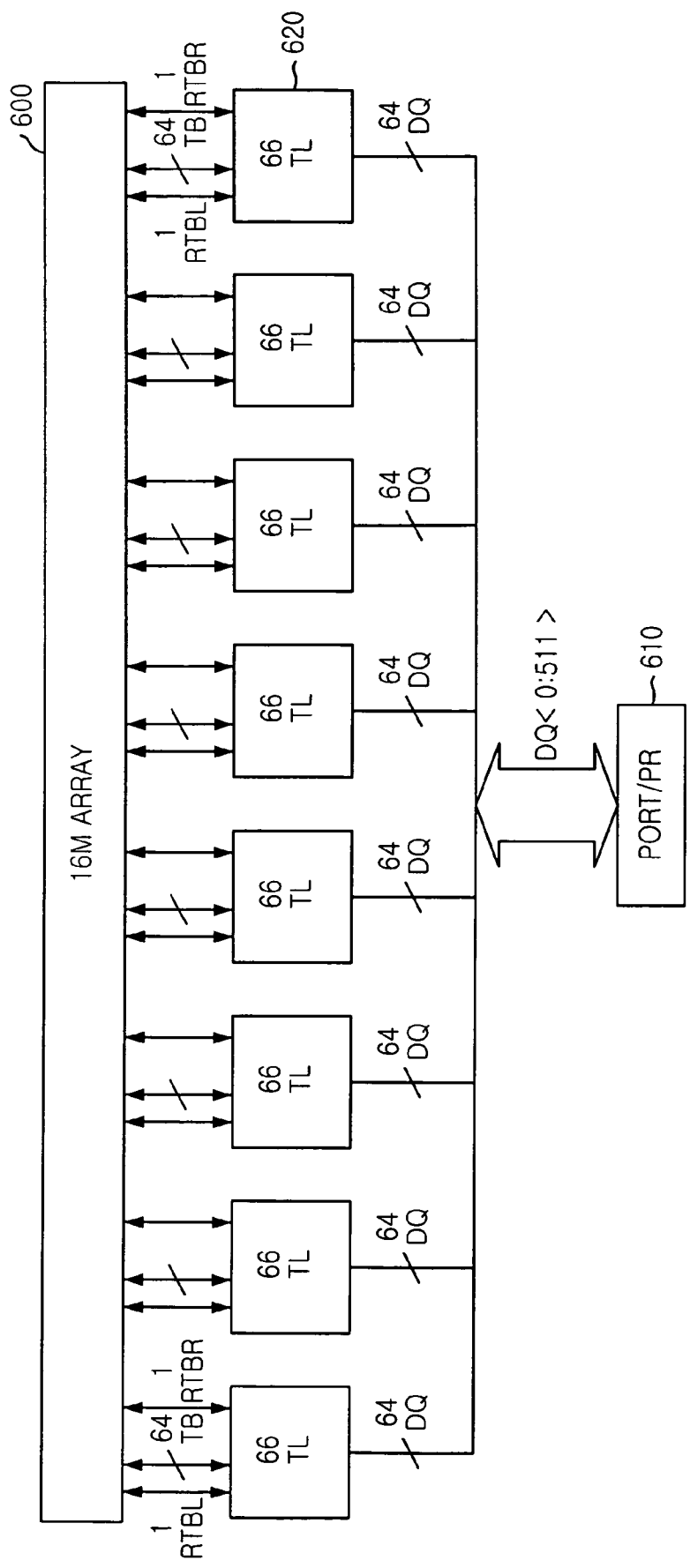
FIG. 6 is a block diagram illustrating a column redundancy scheme of a multi-port memory device in accordance with an embodiment of the present invention.

FIG. 6 is a block diagram illustrating a column redundancy scheme of a multi-port memory device in accordance with an embodiment of the present invention.

Referring to FIG. 6, in case of a 16M cell array (bank side) 600, a multi-port memory device in accordance with the present invention includes eight transfer latch sets 620, each of which has sixty-four transfer latches TL corresponding to 64-bit transfer buses TB and two redundant transfer latches RTL corresponding to left and right redundant transfer buses RTBL and RTBR. In other words, two redundant transfer latches RTL are arranged at every sixty-four transfer latches TL. Sixty-four data DQ are exchanged between sixty-six transfer latches TL and the global data bus GIO. A reference numeral "610" represents a port/PR.

Figure 7:
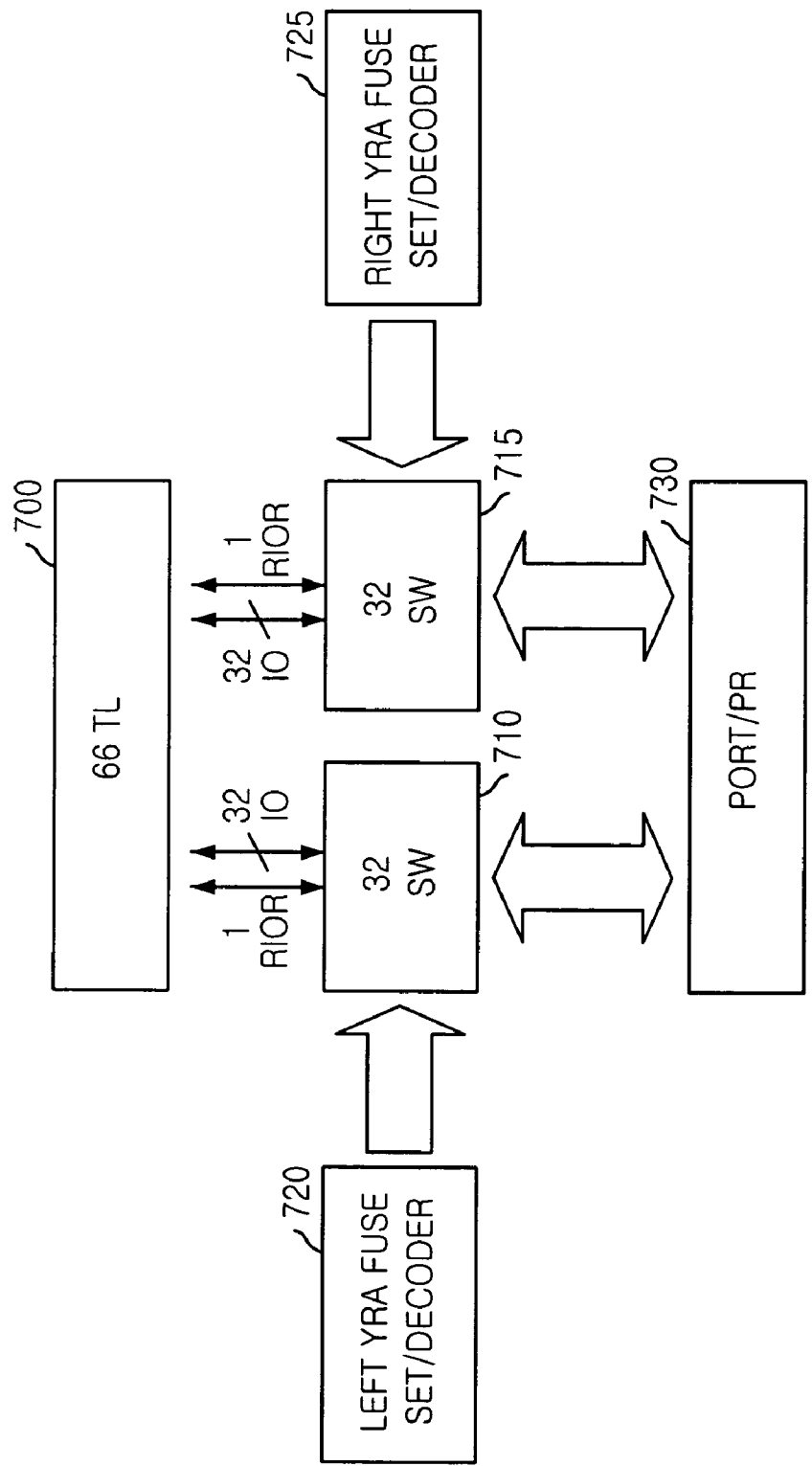
FIG. 7 is a block diagram of a sixty-six transfer latch set shown in FIG. 6.

FIG. 7 is a block diagram of the sixty-six transfer latch set (66 TL) shown in FIG. 6.

Referring to FIG. 7, the sixty-six transfer latch set 620 is divided into half blocks. The half block becomes a column redundant unit block.

In a sixty-six transfer latch set 700, a left half block includes thirty-two switch blocks 710 for receiving thirty-two normal I/Os and one redundant I/O RIOR, and a left column redundancy address (YRA) fuse set circuit/decoder 720 for disabling I/O of a fail column and providing information for converting the redundant I/O into a corresponding physical position.

A right half block includes thirty-two switch blocks 715 for receiving thirty-two normal I/Os and one redundant I/O RIOR, and a right column redundancy address (YRA) fuse set circuit/decoder 725 for disabling I/O of a fail column and providing information for converting the redundant I/O into a corresponding physical position.

Figure 8:
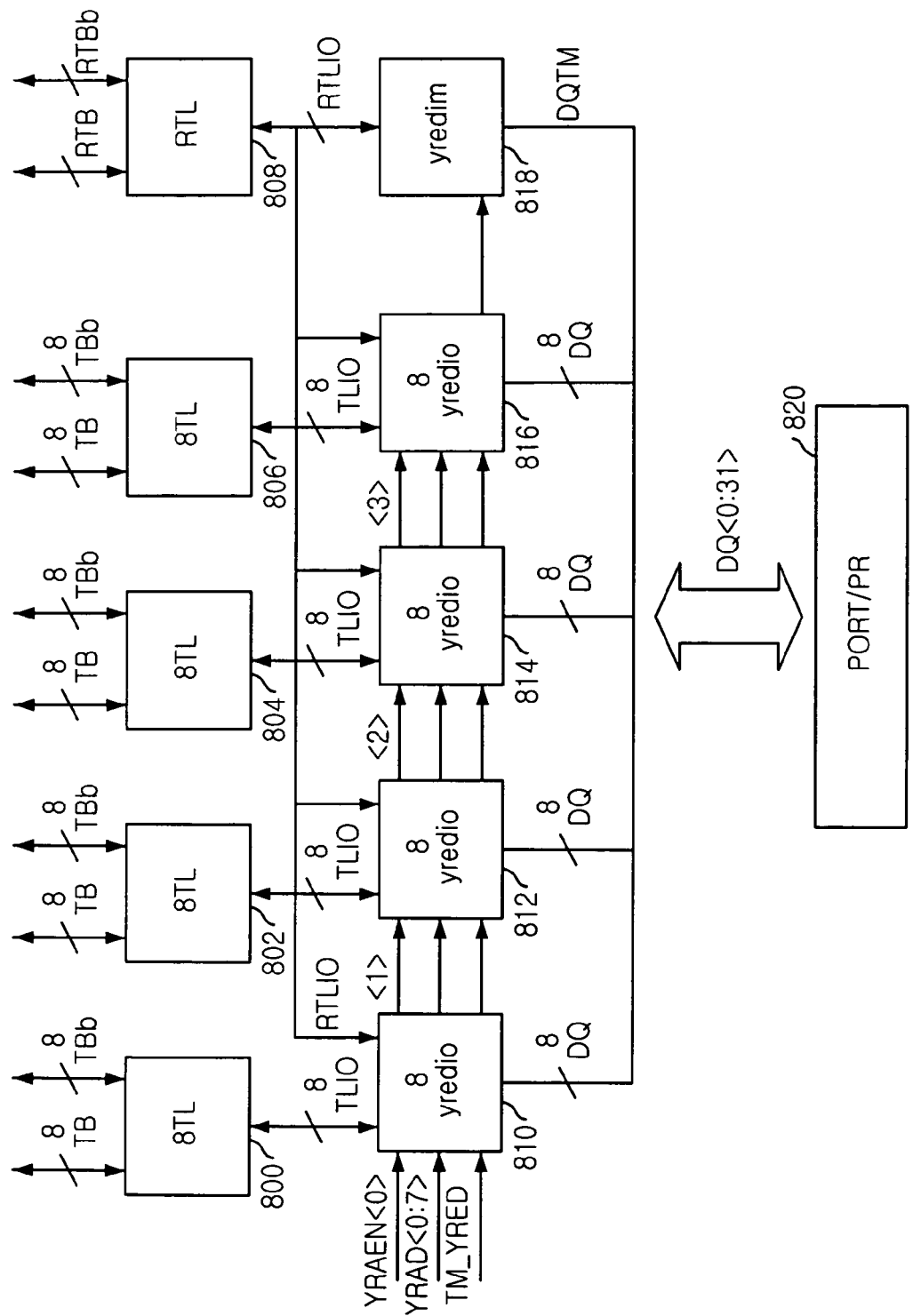
FIG. 8 is a block diagram illustrating a detailed configuration of a half block of FIG. 7.

FIG. 8 is a block diagram of the half block shown in FIG. 7.

Referring to FIG. 8, each half block includes: four normal transfer latch sets 800, 802, 804 and 806, each of which is connected to eight transfer bus pairs TB and TBb and outputs 8-bit normal I/Os 8TLIO; a redundant transfer latch RTL which is connected to one redundant transfer bus pair RTB and RTBb and outputs 1-bit redundant I/O 1RTLIO; four redundant I/O switching parts 810, 812, 814 and 816 for selectively outputting the 8-bit normal I/Os 8TLIO and 1-bit redundant I/O 1RTLIO to 8-bit global data bus lines 8DQ in response to column redundant address enable signals YRAEN<0:3>, column redundant address signals YRAD<0:7> and redundancy test mode flag signal TM_YRED, which are outputted from the left column redundancy address (YRA) fuse set circuit/decoder 720; and a test mode redundant I/O switching part 818 for outputting 1-bit redundant I/b 1RTLIO to 1-bit test mode global data bus line DQTM in response to the redundancy test mode flag signal TM_YRED. A reference numeral "820" represents a port/PR. Also, the redundancy test mode flag signal TM_YRED is a test mode signal that provides the same state as the cut-out fuse in a state that a fuse of the fuse set circuit is not cut actually.

Figure 9:
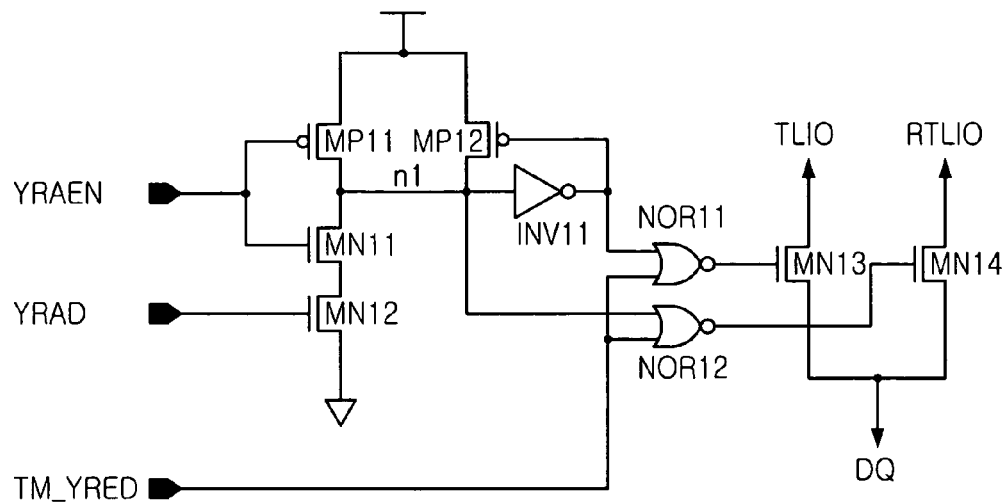
FIG. 9 is a circuit diagram of a redundant I/O switching part shown in FIG. 8.

FIG. 9 is a circuit diagram of the redundant I/O switching part shown in FIG. 8.

Referring to FIG. 9, the redundant I/O switching part 810, 812, 814 or 816 includes a PMOS transistor MP11 which is connected between a power supply terminal and a node n1 and has a gate receiving the column redundant address enable signal YRAEN, an NMOS transistor MN12 which is connected to a ground terminal and has a gate receiving the column redundant address signal YRAD, an NMOS transistor MN11 which is connected between the NMOS transistor MN12 and the node n1 and has a gate receiving the column redundant address enable signal YRAEN, an inverter INV11 for inverting a signal applied on the node n1, a PMOS transistor MP12 which is connected between the power supply terminal and the node n1 and has a gate receiving an output of the inverter INV11, a NOR gate NOR11 having input terminals receiving the output of the inverter INV11 and the redundancy test mode flag signal TM_YRED, a NOR gate NOR12 having input terminals receiving the signal of the node n1 and the redundancy test mode flag signal TM_YRED, an NMOS transistor MN13 which is connected between the normal I/O TLIO and the global data bus DQ and has a gate receiving an output of the NOR gate NOR11, and an NMOS transistor MN14 which is connected between the redundant I/O RTLIO and the global data bus DQ and has a gate receiving an output of the NOR gate NOR12.

In other words, the redundant I/O switching parts 810, 812, 814 and 816 connects the normal I/O TLIO and the global data bus DQ or connects the redundant I/O RTLIO and the global data bus DQ in response to the column redundant address enable signals YRAEN<0:3>, the column redundant address signals YRAD<0:7> and the redundancy test mode flag signal TM_YRED, which are outputted from the left column redundancy address (YRA) fuse set circuit/decoder 720.

Figure 10:
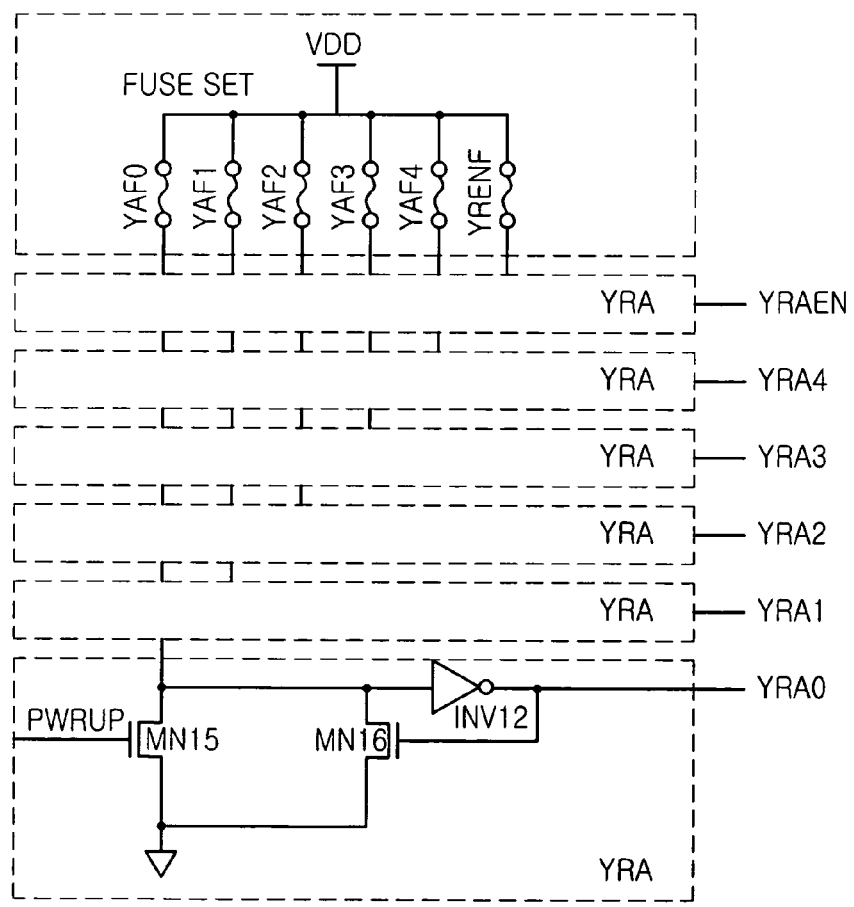
FIG. 10 is a circuit diagram of a fuse set circuit shown in FIG. 7.
Figure 11:
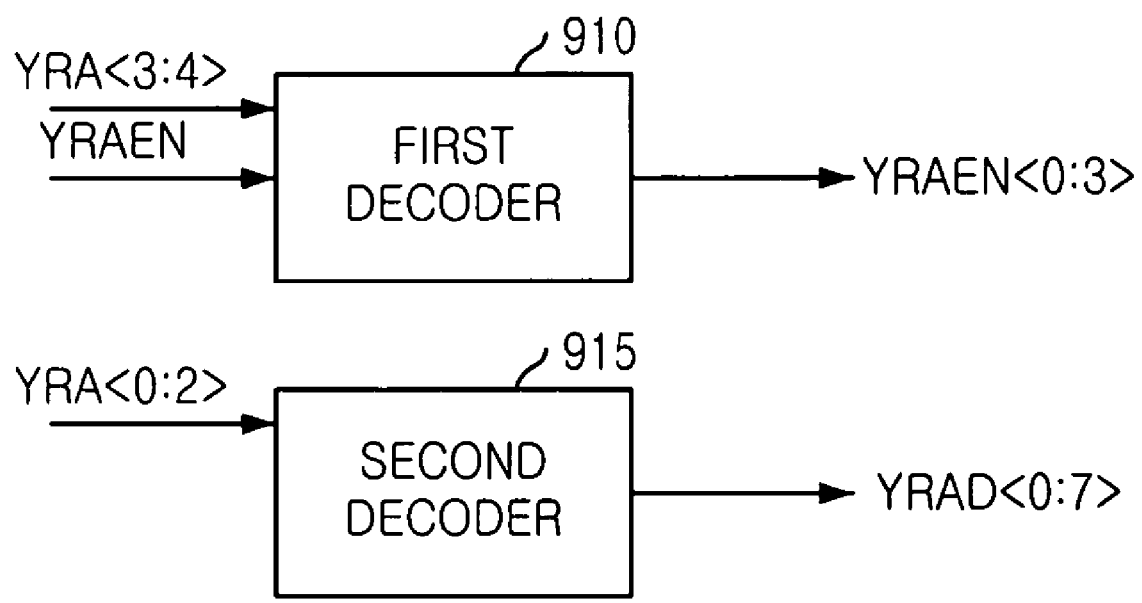
FIG. 11 is a block diagram of a decoder circuit shown in FIG. 7.

FIG. 10 is a circuit diagram of the fuse set circuit shown in FIG. 7, and FIG. 11 is a block diagram of the decoder circuit shown in FIG. 7.

Referring to FIG. 10, the fuse set circuit includes a plurality of fuses YAF0, YAF1, YAF2, YAF3, YAF4 and YRENF connected to the power supply terminal VDD, and a plurality of YRA blocks having different combination of fuse connections.

Here, each YRA block is connected between one fuse and the ground terminal and includes an NMOS transistor MN15 having a gate receiving a power-up signal pwrup, an inverter INV12 connected to a corresponding fuse, and an NMOS transistor MN16 having a gate receiving an output of the inverter INV12.

Referring to FIG. 11, the decoder circuit includes a first decoder 910 for decoding the column redundant address enable signal YRAEN in response to the column redundant address signal YRA<3:4> and outputting the column redundant address enable signal YRAEN<0:3>, and a second decoder 915 for decoding the column redundant address signal YRA<0:2> and outputting the column redundant address signal YRAD<0:7>.

Although the column repair of the multi-port memory device is described in this embodiments, the column redundancy scheme in accordance with the present invention can be applied to semiconductor memory devices having such a structure that a lot of column selection lines are enabled with respect to one column address and can also be applied to a case when a fail column address is not present. Therefore, the redundancy efficiency can be improved and an increase of the chip area can be prevented.

The present application contains subject matter related to Korean patent applications No. 2004-31964, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a normal bus connection means for transmitting/receiving data between global data buses and local data buses of each bank;
a redundant bus connection means for transmitting/receiving data between global data buses and local data buses of each bank;
a fuse set having a physical position information of a fail column; and
a switching means for selectively connecting outputs of the normal bus connection means and the redundant bus connection means to the global data buses, which corresponds to the fail column, in response to the physical position information of the fail column.

\* \* \* \* \*